United States Patent [19]

Kubota

[11] Patent Number: 5,541,549

[45] Date of Patent: Jul. 30, 1996

[54] TRANSFER GATE CIRCUIT AND DYNAMIC DIVIDER CIRCUIT USING THE SAME

[75] Inventor: Miki Kubota, Kawasaki, Japan

[73] Assignee: Fujitsu Limited, Kawasaki, Japan

[21] Appl. No.: 67,621

[22] Filed: May 28, 1993

[30] Foreign Application Priority Data

May 29, 1992 [JP] Japan ................................ 4-139375

[51] Int. Cl.⁶ ............................ H03K 23/52; H03K 17/66
[52] U.S. Cl. ........................ 327/391; 327/389; 327/427; 327/117
[58] Field of Search ............................. 307/279, 280, 307/571, 572, 574, 577; 327/379, 387, 388, 389, 391, 419, 427, 434, 437, 117, 118; 377/47

[56] References Cited

U.S. PATENT DOCUMENTS

| | | | |
|---|---|---|---|
| 4,198,580 | 4/1980 | Culmer | 307/577 |
| 4,511,814 | 4/1985 | Matsuo et al. | 307/577 |
| 4,523,111 | 6/1985 | Baliga | 307/574 |
| 4,544,854 | 10/1985 | Ulmer et al. | 307/576 |
| 4,590,396 | 5/1986 | Koike | 307/577 |
| 4,682,061 | 7/1987 | Donovan | 307/577 |
| 5,003,566 | 3/1991 | Gabillard et al. | 307/279 |
| 5,023,688 | 6/1991 | Ando et al. | 307/279 |
| 5,315,188 | 5/1994 | Lee | 307/296.2 |

FOREIGN PATENT DOCUMENTS

| | | |
|---|---|---|
| 61-054711 | 3/1986 | Japan . |
| 63-093217 | 4/1988 | Japan . |
| 2-95014 | 4/1990 | Japan . |
| 4-16023 | 1/1992 | Japan . |

OTHER PUBLICATIONS

Electronic circuit, Discrete and Integrated by Donald L. Schilling 1989.

Primary Examiner—Timothy P. Callahan
Assistant Examiner—T. Lam
Attorney, Agent, or Firm—Staas & Halsey

[57] ABSTRACT

A transfer gate circuit has a FET 1 and FET 2 connected in series each other, both gates of which are connected commonly. The threshold voltage of the FET 1 is lower than that of the FET 2. A dynamic divider circuit has this transfer gate circuit connected between an output of one source follower circuit and an input of another source follower circuit.

5 Claims, 4 Drawing Sheets

Fig.4A IN 
Fig.4B *IN 
Fig.4C IN20 
Fig.4D OUT 
Fig.4E IN10 

TRANSFER GATE CIRCUIT AND DYNAMIC DIVIDER CIRCUIT USING THE SAME

BACKGROUND OF THE INVENTION

1. Field of the Invention

The present invention relates to a transfer gate circuit composed of FETs (Field Effect Transistors) and a dynamic divider circuit using such a transfer gate circuit.

2. Description of the Related Art

The divider circuit is well known in the art of digital circuitry. For example, a PLL synthesizer circuit has included the divider circuit for dividing a frequency of output signal from a quartz oscillator. The divider circuit functions as not only a frequency divider but also a binary counter.

FIG. 3 shows a known dynamic ½ divider circuit using transfer gate circuits. This type of ½ divider circuit is disclosed in Japanese Patent Publication No. 2-95014 and No. 4-16023.

The ½ divider circuit has a source follower circuit 10 which is connected at its output end to an input of a source follower circuit 20 through a transfer gate 31. An output of the source follower circuit 20 is connected to an input of another source follower circuit 10 through an inverter circuit 32 and a transfer gate 33.

The source follower circuit 10 has a D-MESFET (Depletion Mode of Metal Semiconductor FET) 11 a drain D of which is connected to a ground line GND while a source S of which is connected to a power supply line VEE via a level shift diode 12 and a D-MESFET 13. The D-MESFET 13 which gate G is connected to its source S forms a constant-current source. The input and output of the source follower circuit 10 are respectively the gate G and the source S of the D-MESFET 11.

The source follower circuit 20 has the same construction as the source follower circuit 10. Namely, the source follower circuit 20 has a D-MESFET 21 a drain of which is connected to the ground line GND. A source S of the D-MESFET 21 is connected to the power supply line VEE via a level shift diode 22 and a D-MESFET 23. The D-MESFET 23 which gate G is connected to its source S forms a constant-current source. The input and the output of the source follower circuit 20 are respectively the gate G and the source S of the D-MESFET 21.

The ½ divider circuit described above operates as shown in FIG. 4A to 4E, in response to a variable-frequency input signal IN supplied to a gate G of the transfer gate 33 and an input signal supplied to a gate G of the transfer gate 31, where *IN is inverse relation to IN in binary logic level.

(1) It is assumed as shown in parentheses in FIG. 3 that, in the initial state of the ½ divider circuit, the input signals IN and *IN are high (H) and low (L) levels respectively, while the gate G of the D-MESFET 21 is low level (L). In this state, the transfer gate 31 and 33 are off and on respectively, the D-MESFET 21 is off, the input and output of the inverter circuit 32 are low and high levels respectively, the gate G (IN10) and source of the D-MESFET 11 are high and low level.

(2) Then, the input signal IN and *IN turn to low and high levels respectively, so the transfer gate 33 turns off, the gate G of the D-MESFET 11 is held at high level and the output level of the source follower circuit 10 are held unchanged. While the transfer gate 31 turns on, the gate G (IN20) of the D-MESFET 21 turns to a high level, the output of the D-MESFET 21 turns to high level and the output signal OUT turns to a low level.

(3) Subsequently, the input signals IN and *IN turn to high and low levels respectively, so the transfer gate 31 turns off, the gate G of the D-MESFET 21 is held at a high level and the output of the source follower circuit 20 is held unchanged. Accordingly, the output signal OUT also is held at the low level. While, the transfer gate 33 turns on, the gate G of the D-MESFET 11 turns to a low level and the output of the source follower circuit 10 turns to a low level.

(4) Subsequently, the input signal IN and *IN turn to low and high levels, respectively, so the transfer gate 33 turns off, the gate G of the D-MESFET 11 is held at a low level and the output levels of the source follower circuit 10 is held unchanged. While, the transfer gate 31 turns on, the gate G of the D-MESFET 21 turns to a low level, the output of the source follower circuit 20 turns to a low level and the output signal OUT turns to a high level.

The above-described operation is repeated, the obtaining output signal OUT as the ½ frequency division of the input signal IN.

The above-described dynamic ½ divider circuit excels in the high speed operation and can operate when the input signal has a high frequency within the range of 3 to 10 GHz.

This divider circuit, on the other hand, suffers from the following disadvantage. When the frequency of the input signal IN is low and the states of the signals are inverse to those shown in the parentheses in FIG. 3, time integration of the leak current, which flows from the input of the source follower circuit 20 to the output of the source follower circuit 10 through the transfer gate 31, grows to a level which is not negligible. Consequently, the levels of the input and the output of the source follower circuit 20 are undesirably inverted to cause erroneous operation of the ½ frequency divider circuit.

SUMMARY OF THE INVENTION

Accordingly, an object of the present invention is to provide a transfer gate circuit which can operate at a lower frequency than ever while maintaining high speed operation and also to provide a dynamic divider circuit which incorporates such a transfer gate circuit.

To this end, according to one aspect of the present invention, there is provided a transfer gate circuit for switching on or off between a first end and a second end in dependence on voltage of a control gate, comprising: a first FET having a first end which is the first end of the transfer gate circuit, a second end and a gate which voltage controls channel depth between the first end and the second end of the first FET; and a second FET having a first end connected to the second end of the first FET, a second end which is the second end of the transfer gate circuit and a gate which voltage controls channel depth between the first end and the second end of the second FET, the gate of the second FET being connected to the gate of the first FET and forming the control gate of the transfer gate circuit together with the gate of the first FET, having a threshold voltage higher than a threshold voltage of the first FET. The FETs could be MOSFETS.

According to another aspect of the present invention, there is provided a dynamic divider circuit, comprising: a first source follower circuit having a first FET a gate of which is an input of the first source follower circuit while a source of which is an output of the first source follower circuit, having a first constant current source connected to the source of the first FET; a second source follower circuit having a second FET a gate of which is an input of the second source follower circuit while a source of which is an output of the second source follower circuit, having a second constant current source connected to the source of the second FET; and a first transfer gate circuit for switching on or off between a first end connected to the output of the first source follower circuit and a second end connected to the input of the second source follower circuit in dependence on voltage of a control gate which receives a first clock signal; the first transfer gate circuit including; a third FET having a first end which is the first end of the first transfer gate circuit, a second end and a gate which voltage controls channel depth between the first end and the second end of the third FET; and a fourth FET having a first end connected to the second end of the third FET, a second end which is the second end of the first transfer gate circuit and a gate which voltage controls channel depth between the first end and the second end of the fourth FET, the gate of the fourth FET being connected to the gate of the third FET and forming the control gate of the first transfer gate circuit together with the gate of the third FET, having a threshold voltage higher than a threshold voltage of the third FET. The FETs could be MESFETS.

The features and advantages of the present invention will become clear from the following description of the preferred embodiments when the same is read in conjunction with the accompanying drawings.

BRIEF DESCRIPTION OF THE DRAWINGS

FIG. 4A to 4E is a time chart illustrative of the operation of the ½ divider circuit shown in FIG. 2 and 3.

DESCRIPTION OF THE PREFERRED EMBODIMENTS

Figure 1A:
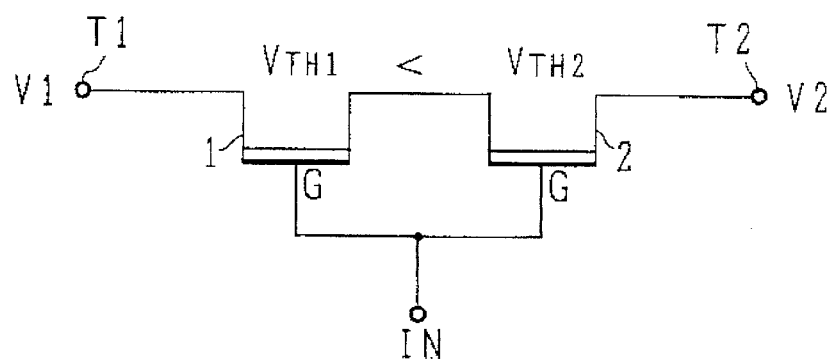
FIG. 1A is a diagram of a transfer gate circuit in accordance with the present invention.
Figure 1B:
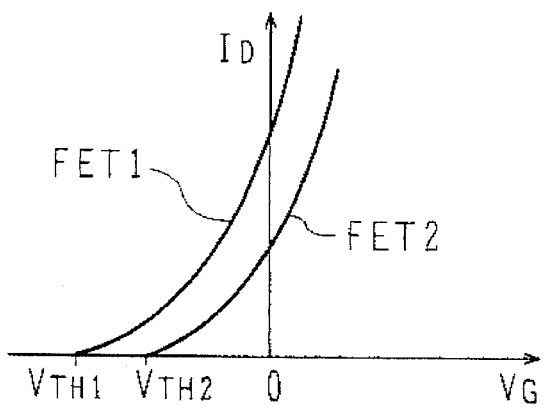
FIGS. 1B to 1D are charts illustrative of the drain current ID-to-gate voltage VG characteristics of FETs 1 and 2 incorporated in the transfer gate circuit shown in FIG. 1A.
Figure 1C:
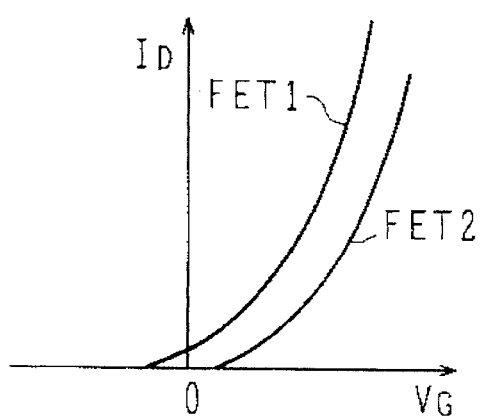
Figure 1D:
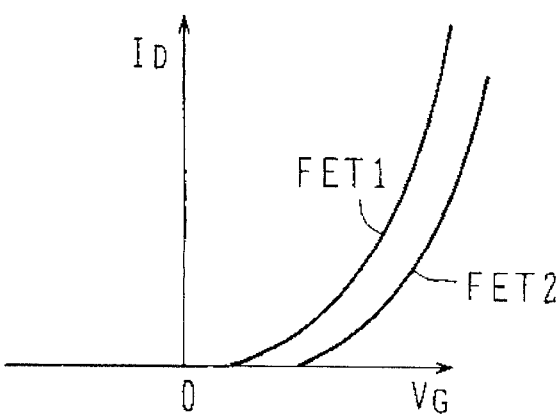

As shown in FIG. 1A, a transfer gate circuit has a first FET 1 and a second FET 2 connected in series to each other, both gates of which are connected commonly. As shown in FIGS 1B to 1D for examples, the threshold voltage $V_{TH1}$ of the FET 1 is lower than that $V_{TH2}$ of the FET 2. FIGS. 1B to 1D show the drain current ID-to-gate voltage VG characteristics of the FETs 1 and 2. FIG. 1B shows the characteristic as obtained when both the FETs 1 and 2 are of depletion mode, FIG. 1C shows the characteristic as obtained when the first FET 1 and the second FET 2 are of depletion mode and enhancement mode respectively and FIG. 1D shows the characteristic which is obtained when both the first and second FETs 1 and 2 are of enhancement mode. The present invention can adopt any of the foregoing three types of combinations of the FETs shown in FIGS. 1B, 1C and 1D.

In case of using the combination shown in FIG. 1B, a resistance of the first FET 1 is lower than below-described case and the FET 2 is on when the input signal IN is high level, which is higher than the threshold voltage $V_{TH2}$, and the resistance of the FET 1 is higher than above-described case and the FET 2 is off when the input signal IN is low level, which is lower than the threshold voltage $V_{TH2}$. Thus, the FET 1 functions as a variable resistor.

Consequently, under such a condition that the voltage V1 at one end T1 of the transfer gate circuit is low, the voltage V2 at the other end T2 of the transfer gate circuit is high and the input signal IN supplied to the gate is low, the magnitude of the current leaking from the end T2 to the end T1 is smaller than that in the known transfer gate circuit, allowing the transfer gate circuit to operate at a lower frequency than ever while maintaining high speed operation.

The operation is likely the same in other two cases as above-described case.

Figure 2:
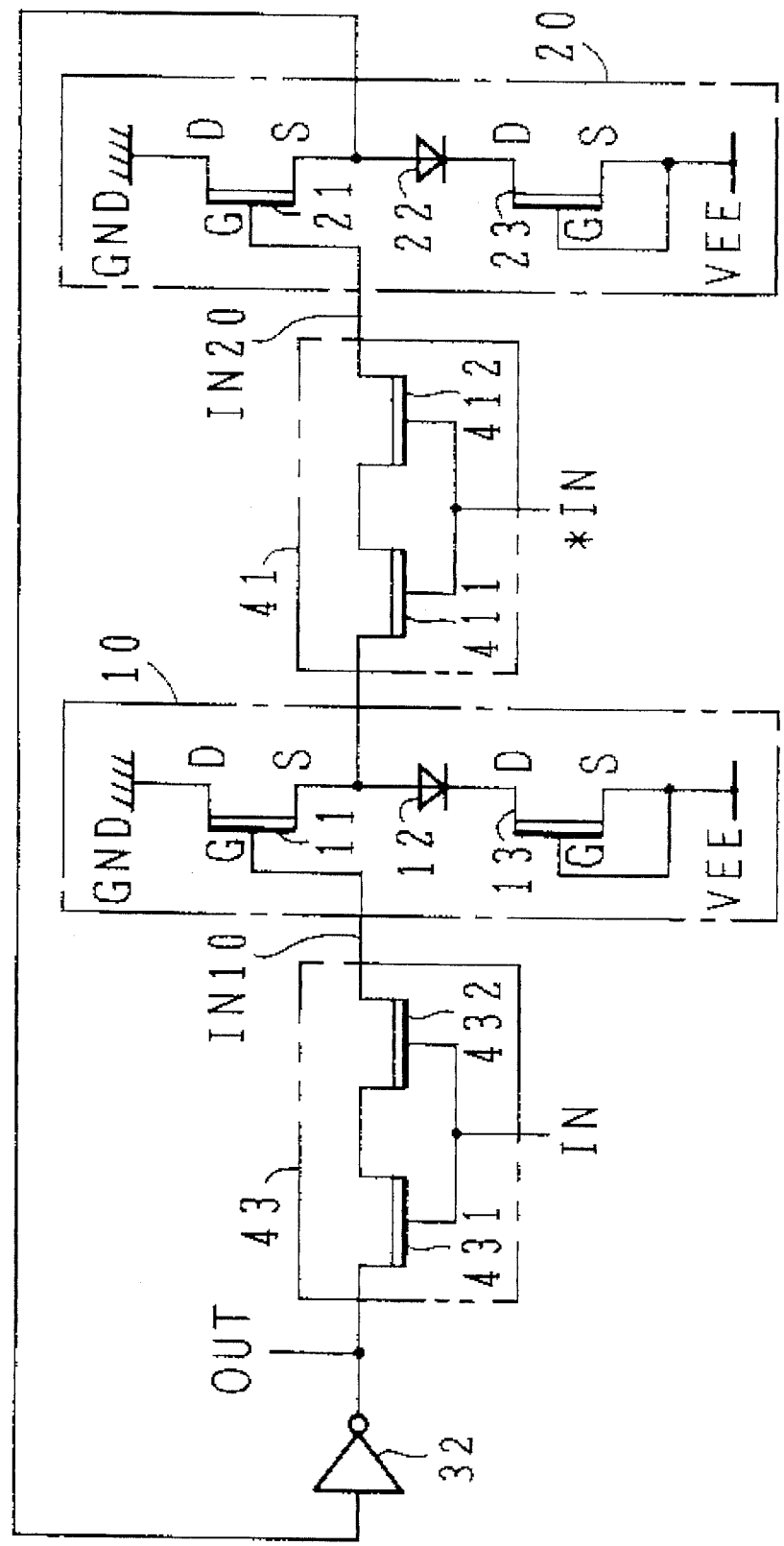
FIG. 2 is a diagram of a dynamic ½ divider circuit.

FIG. 2 shows the embodiment of the dynamic ½ divider circuit of the present invention. In FIG. 2, the same reference numerals are used to denote parts or components which are the same as those appearing in FIG. 3.

Figure 3:
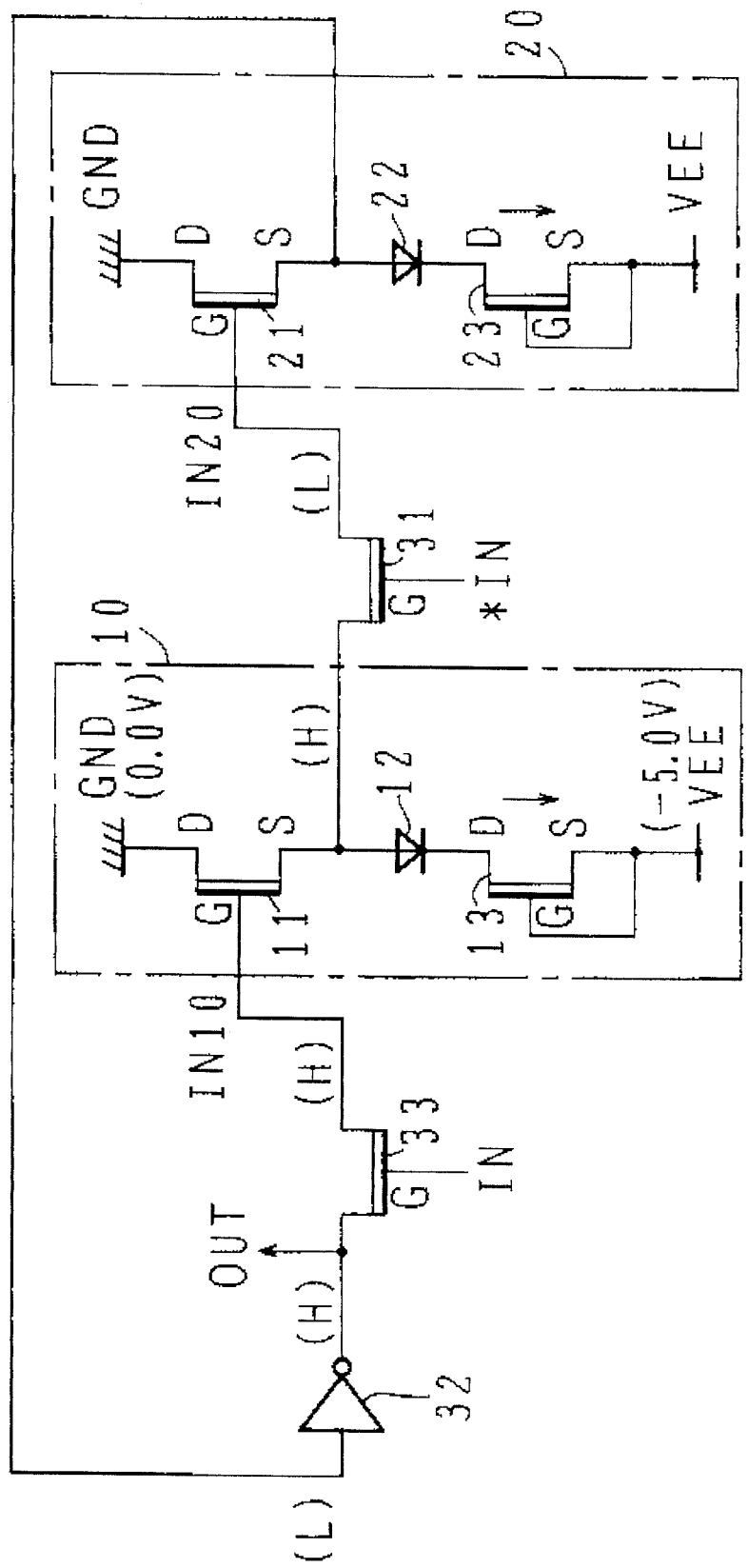
FIG. 3 is a diagram of a known dynamic ½ divider circuit.

The ½ divider circuit shown in FIG. 2 is different from that shown in of FIG. 3 in that transfer gate circuits 41 and 43 are substituted for the transfer gate circuits 31 and 33 in FIG. 3. Each of the transfer gate circuits 41 and 43 has the same construction as that shown in FIG. 1A.

In more detail, the transfer gate circuit 41 has a series connection of a D-MESFET 411 and a D-MESFET 412 both gates G of which are connected to each other to receive an input signal *IN commonly. The threshold voltage of the D-MESFET 412, e.g., −1.0 V, is higher than that of the D-MESFET 411, e.g., −1.5 V. Consequently, the D-MESFET 411 operates as such a variable resistor that exhibit a low resistance when the input signal *IN is at high level and the D-MESFET 412 is on and exhibit a high resistance when the input signal *IN is at low level and the D-MESFET 412 is off.

Similarly, the transfer gate circuit 43 has a series connection of a D-MESFET 431 and a D-MESFET 432 both gates G of which are connected to each other to receive an input signal IN commonly. The threshold voltage of the D-MESFET 432, e.g., −1.0 V, is higher than that of the D-MESFET 431, e.g., −1.5 V. Consequently, the D-MESFET 431 operates as such a variable resistor that exhibit a low resistance when the input signal IN is at high level and the D-MESFET 432 is on and exhibit a high resistance when the input signal IN is at low level and the D-MESFET 432 is off.

The above-described dynamic ½ divider circuit operates as shown in FIG. 4A to 4E. A simulation test was executed in regard to the ½ divider circuits shown in FIGS. 2 and 3. It is proved that the ½ divider circuit shown in FIG. 2 can operate without fail within a range of 1 to 10 GHz of the input signals IN and *IN, while the known ½ divider circuit shown in FIG. 3 can operate without fail only within a range of 3 to 10 GHz of the input signal IN.

It has thus been confirmed that the present dynamic ½ frequency divider circuit can operate at lower frequency than the known dynamic ½ divider circuit with maintaining its high speed operation.

A multi-divider circuit can be constructed by cascade-connecting plural ½ divider circuits, each of which is the same as shown in FIG. 2 except adding another inverter circuit an input of which is connected to the output of the inverter circuit 32 while an output of which is used as another output of the ½ divider circuit.

While there has been described what is at present considered to be preferred embodiment of the invention, it will be understood that various modifications may be made therein, and it is intended to cover in the appended claims all such modifications as fall within the true spirit and scope of the invention.

What is claimed is:

1. A transfer gate circuit comprising:
   a first depletion-mode MESFET comprising a first gate and having a first threshold voltage; and
   a second depletion-mode MESFET, being connected in series to said first depletion-mode MESFET, comprising a second gate connected to the first gate and having a second threshold voltage higher than said first threshold voltage.

2. A dynamic frequency dividing circuit comprising:
   a first source follower circuit comprising and input and an output;
   a second source follower circuit comprising an input and an output;
   a first transfer gate circuit connected between the output of the first source follower circuit and the input of the second source follower circuit, said transfer gate circuit comprising:
      a first depletion-mode MESFET comprising a first gate and having a first threshold voltage, and
      a second depletion-mode MESFET, connected in series to said first depletion-mode MESFET, comprising a second gate connected to the first gate and having a second threshold voltage higher than said first threshold voltage;
   an inverter circuit comprising an input connected to said output of said second source follower circuit; and
   a second transfer gate circuit connected between an output of said inverted circuit and said input of said first source follower circuit, said second transfer gate circuit comprising:
      a third depletion-mode MESFET comprising a third gate and having a third threshold voltage, and
      a fourth depletion-mode MESFET, connected in series to said third depletion-mode MESFET, comprising a fourth gate connected to the third gate of said third depletion-mode MESFET and having a fourth threshold voltage higher than the third threshold voltage.

3. A dynamic frequency dividing circuit according to claim 2,
   wherein said first source follower circuit has a fifth depletion-mode MESFET comprising a gate which is an input of said first source follower circuit and comprising a source which is said output of said first source follower circuit, and
   wherein said second source follower circuit has a sixth depletion-mode MESFET comprising a sixth gate which is said input of said second source follower circuit and comprising a source which is an output of said second source follower circuit.

4. An integrated circuit comprising:
   a transfer gate circuit comprising:
      a first depletion-mode MESFET comprising a first gate and having a first threshold voltage; and
      a second depletion-mode MESFET, being connected in series to said first depletion-mode MESFET, comprising a second gate connected to the first gate and having a second threshold voltage higher than said first threshold voltage.

5. An integrated circuit comprising:
   a first source follower circuit comprising an input and an output;
   a second source follower circuit comprising an input and an output;
   a first transfer gate connected between the output of the first source follower circuit and the input of the second source follower circuit, said first transfer gate circuit comprising:
      a first depletion-mode MESFET comprising a first gate and having a first threshold voltage; and
      a second depletion-mode MESFET, connected in series to said first depletion-mode MESFET, comprising a second gate connected to the first gate and having a second threshold voltage higher than said first threshold voltage;
   an inverter circuit comprising an input connected to said output of said second source follower circuit; and
   a second transfer gate circuit connected between an output of said inverted circuit and said input of said first source follower circuit, said second transfer gate circuit comprising:
      a third depletion-mode MESFET comprising a third gate and having a third threshold voltage, and
      a fourth depletion-mode MESFET, connected in series to said third depletion-mode MESFET, comprising a fourth gate connected to the third gate of said third depletion-mode MESFET and having a fourth threshold voltage higher than the third threshold voltage.

* * * * *